United States Patent
Shabbir et al.

(10) Patent No.: US 9,823,636 B2
(45) Date of Patent: Nov. 21, 2017

(54) SYSTEMS AND METHODS FOR PARALLEL FEEDBACK TEMPERATURE CONTROL

(71) Applicant: Dell Products L.P., Round Rock, TX (US)

(72) Inventors: Hasnain Shabbir, Round Rock, TX (US); Dominick A. Lovicott, Round Rock, TX (US); Hsiang-Jung Chin, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 528 days.

(21) Appl. No.: 14/445,419

(22) Filed: Jul. 29, 2014

(65) Prior Publication Data
US 2016/0033972 A1    Feb. 4, 2016

(51) Int. Cl.
*G05B 15/02* (2006.01)
*G06F 1/20* (2006.01)
*H01L 23/34* (2006.01)
*H01L 23/467* (2006.01)

(52) U.S. Cl.
CPC ........... *G05B 15/02* (2013.01); *G06F 1/206* (2013.01); *H01L 23/34* (2013.01); *H01L 23/467* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 2005/0066672 A1* | 3/2005 | Yamamoto | ......... | H05K 7/20209 62/186 |
| 2005/0240316 A1* | 10/2005 | Mayer | ............... | H05K 7/20209 700/300 |
| 2009/0228148 A1* | 9/2009 | Byquist | .................... | G01K 7/42 700/275 |
| 2009/0312874 A1* | 12/2009 | Herman | ................ | G05D 23/19 700/275 |
| 2011/0002098 A1* | 1/2011 | Xu | .......................... | H01L 23/34 361/679.46 |
| 2012/0048467 A1* | 3/2012 | Mahadeswaraswamy | ................ | H01J 37/32522 156/345.27 |
| 2013/0178999 A1* | 7/2013 | Geissler | ............. | H05K 7/20836 700/300 |
| 2014/0121854 A1* | 5/2014 | Conroy | .................... | G06F 1/26 700/300 |

* cited by examiner

*Primary Examiner* — Jason Lin
(74) *Attorney, Agent, or Firm* — Jackson Walker L.L.P.

(57) ABSTRACT

In accordance with embodiments of the present disclosure, a system may include a first feedback controller, a second feedback controller, and logic. The first feedback controller may be configured to calculate a first intermediate air mover speed based on a measured temperature. The second feedback controller may be configured to calculate a second intermediate air mover speed based on the measured temperature. The logic may be configured to select a maximum of the first intermediate air mover speed and the second intermediate air mover speed as a selected air mover speed and generate a control signal indicative of the selected air mover speed.

6 Claims, 1 Drawing Sheet

SYSTEMS AND METHODS FOR PARALLEL FEEDBACK TEMPERATURE CONTROL

TECHNICAL FIELD

The present disclosure relates in general to information handling systems, and more particularly to controlling a closed-loop system (e.g., an air mover and an associated closed-loop control system within an information handling system).

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Some information handling systems support multiple heat sink solutions for the same component (e.g., processor), for example, as an acoustic option for consumers who prefer quieter systems with low air mover speeds.

Control of an air mover typically uses a proportional-integral-derivative (PID) closed-loop control system in order to regulate air mover speed and maintain acceptable temperatures of components. Typical PID closed-loop control is based on a mathematical equation summing proportional, integral, and derivative terms of the variable (e.g., air mover speed) being controlled. To prevent instability, oscillation, and/or lag, and/or to optimize PID control, a PID controller often utilizes parameters (e.g., mathematical coefficients) that may be defined to a particular component, but may not be readily differentiated for different heat sinks without adding a heat sink detection circuit or developing a more complex adaptive control scheme. Because optimizing such parameters may be dependent upon the transient thermal response of a heat sink, it may not be possible to optimize for multiple heat sink solutions.

SUMMARY

In accordance with the teachings of the present disclosure, the disadvantages and problems associated with control of a temperature control system may be substantially reduced or eliminated.

In accordance with embodiments of the present disclosure, a system may include a first feedback controller, a second feedback controller, and logic. The first feedback controller may be configured to calculate a first intermediate air mover speed based on a measured temperature. The second feedback controller may be configured to calculate a second intermediate air mover speed based on the measured temperature. The logic may be configured to select a maximum of the first intermediate air mover speed and the second intermediate air mover speed as a selected air mover speed and generate a control signal indicative of the selected air mover speed.

In accordance with these and other embodiments of the present disclosure, a method may include calculating a first intermediate air mover speed based on a measured temperature with a first feedback controller. The method may also include calculating a second intermediate air mover speed based on the measured temperature with a second feedback controller. The method may further include selecting a maximum of the first intermediate air mover speed and the second intermediate air mover speed as a selected air mover speed. The method may additionally include generating a control signal indicative of the selected air mover speed.

In accordance with these and other embodiments of the present disclosure, an information handling system may include an air mover and an air mover control system. The air mover control system may be configured to control a velocity of the air mover, the air mover control system comprising a first feedback controller, a second feedback controller, and logic. The first feedback controller may be configured to calculate a first intermediate air mover speed based on a measured temperature. The second feedback controller may be configured to calculate a second intermediate air mover speed based on the measured temperature. The logic may be configured to select a maximum of the first intermediate air mover speed and the second intermediate air mover speed as a selected air mover speed and generate a control signal indicative of the selected air mover speed.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
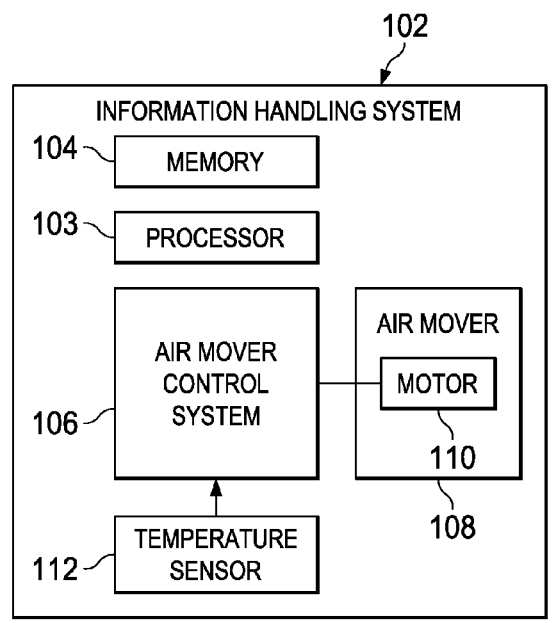
FIG. 1 illustrates a block diagram of an example information handling system, in accordance with the present disclosure.
Figure 2:
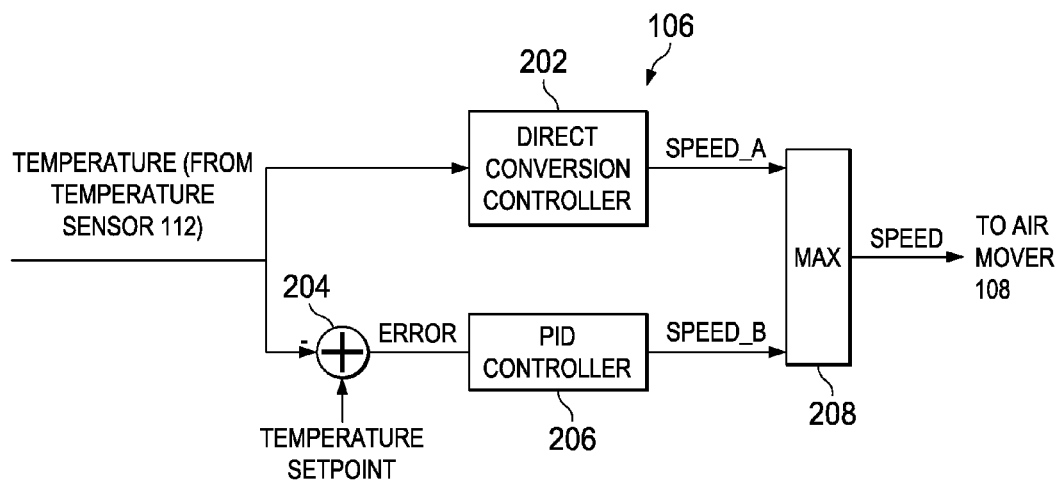
FIG. 2 illustrates a block diagram of selected components of an example air mover control system, in accordance with the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, busses, memories, I/O devices and/or interfaces, storage resources, network interfaces, motherboards, integrated circuit packages; electro-mechanical devices (e.g., air movers), displays, and power supplies.

FIG. 1 illustrates a block diagram of an example information handling system 102, in accordance with the present disclosure. In some embodiments, information handling system 102 may comprise a server chassis configured to house a plurality or servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may comprise a processor 103, a memory 104, an air mover control system 106, an air mover 108, and a temperature sensor 112.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102. Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover control system 106 may be communicatively coupled to processor 103 and may include any system, device, or apparatus configured to receive one or more signals indicative of one or more temperatures within information handling system 102 (e.g., one or more signals from one or more temperature sensors 112), and based on such signals, calculate an air mover driving signal to maintain an appropriate level of cooling, increase cooling, or decrease cooling, as appropriate, and communicate such air mover driving signal to air mover 108. Example functionality of air mover control system 106 is set forth in greater detail with respect to the discussion of FIG. 2, below.

Air mover 108 may be communicatively coupled to air mover control system 106, and may include any mechanical or electro-mechanical system, apparatus, or device operable to move air and/or other gasses. In some embodiments, air mover 108 may comprise a fan (e.g., a rotating arrangement of vanes or blades which act on the air). In other embodiments, air mover 108 may comprise a blower (e.g., centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by the air mover control signal communicated from air mover control system 106. In operation, air mover 108 may cool information handling resources of information handling system 102 by drawing cool air into an enclosure housing the information handling resources from outside the chassis, expel warm air from inside the enclosure to the outside of such enclosure, and/or move air across one or more heatsinks (not explicitly shown) internal to the enclosure to cool one or more information handling resources.

A temperature sensor 112 may be any system, device, or apparatus (e.g., a thermometer, thermistor, etc.) configured to communicate a signal to air mover control system 106 indicative of a temperature within information handling system 102.

For ease of exposition, FIG. 1 depicts only one each of air mover control system 106, air mover 108, and temperature sensor 112. However, it is noted that information handling system 102 may include two or more air movers 108 and each such air mover 108 may have a dedicated respective air mover control system 106. It is further noted that an air mover control system 106 may receive temperature signals from one or more temperature sensors 112, and that a single temperature sensor 112 may communicate temperature signals to one or more air mover control systems 106.

In addition to processor 103, memory 104, air mover control system 106, air mover 108, and temperature sensor 112, information handling system 102 may include one or more other information handling resources.

FIG. 2 illustrates a block diagram of selected components of an example air mover control system 106, in accordance with the present disclosure. As shown in FIG. 2, air mover control system 106 may comprise a plurality of control paths. For example, in the embodiments represented by FIG. 2, air mover control system 106 may include two control paths: one including direct conversion controller 202 and one including PID controller 206. Although specific types and numbers of controllers are shown in FIG. 2, the methods and systems disclosed herein may apply to any number and/or types of controllers.

Each control path of air mover control system 106 may receive a signal indicative of a temperature of information handling system 102 (e.g., from temperature sensor 112) and based on such temperature, generate an intermediate signal (e.g., SPEED_A, SPEED_B) indicative of a speed for motor 110 of air mover 108. For example, in some embodiments, a control path may include a direct conversion controller 202 that uses temperature feedback to correlate a temperature to a particular speed (e.g., SPEED_A) in accordance with a lookup table (e.g., a table, map, database, or other data structure) that associates one or more measured temperatures to corresponding air mover setpoint velocities. Such lookup table may be created by characterization of the thermal system during development of information handling system 102, by way of an in-system characterization routine. In some embodiments, such direct conversion controller 202 may be fine-tuned or adapted with a cooling profile suitable for use with a component (e.g., a processor) having an acoustic heat sink. Such an acoustic heat sink may conduct heat away from a component more efficiently than a standard heat sink (e.g., may have greater surface area than a standard heat sink), and thus may allow air mover 108 to operate at lower speeds for motor 110, thus minimizing acoustic noise generated by air mover 108.

In addition or alternatively, in some embodiments, a control path may include a summer 204 and a PID controller 206. Summer 204 may calculate an error between a temperature setpoint (e.g., representing a maximum operating temperature) and a measured temperature (e.g., as indicated from a signal communicated from temperature sensor 112). PID controller 206 may generate an intermediate signal indicative of a speed (e.g., SPEED_B) for motor 110 of air mover 108 in order to reduce the error between the temperature setpoint and the measured temperature. In some embodiments, PID controller 206 may be fine-tuned or adapted with PID parameters to optimize thermal performance with respect to a specific information handling resource (e.g., processor 103) of information handling system 102 assuming a "worst-case" heat sink thermally coupled to such information handling resource.

As shown in FIG. 2, air mover control system 106 may include a maximum detection control block 208 which may receive the speed control signals (e.g., SPEED_A, SPEED_B) generated by the plurality of control paths and may select the signal having the greatest speed of the speed control signals as the speed control signal to be communicated to motor 110 of air mover 108. Accordingly, in operation of the embodiments represented by FIG. 2, while the temperature sensed by temperature sensor 112 remains below the temperature setpoint input to summer 204, responses in temperature caused by increased utilization and power consumption of information handling resources of information handling system 102 may result in a proportionate response from direct conversion controller 202 to regulate the temperature. If an acoustic heat sink is installed, the temperature may stabilize below the temperature setpoint and additional air mover speed may not be needed to maintain adequate cooling. However, if a standard heat sink is installed, temperature may continue to rise and additional air mover speed beyond that given by direct conversion controller 202 may be required to provide adequate cooling. Accordingly, at some point the intermediate speed generated by PID controller 206 will exceed that generated by direct conversion controller 202, thus providing the thermal response required beyond that available from direct conversion controller 202.

The methods and systems disclosed herein may have one or more advantages over traditional approaches. For example, the use of a plurality of parallel feedback control schemes may enable an adaptable response to different heat sinks without requiring a heat sink detection circuit and/or additional PID tuning for additional heat sinks when multiple heat sinks are used for the same information handling resource. In addition, simulation results have shown that in the embodiments represented by FIG. 2, the response of direct conversion controller 202 may "mask" an undesirable portion of a response of PID controller 206 at lower temperatures which may include overshoot and/or oscillation of the speed signal generated by PID controller 206 unless significant tuning of PID parameters is undertaken.

Although the foregoing discussion contemplated application systems and methods for closed-loop control to operation of an air mover, similar methods and systems may be generalized and applied to other closed loop controls.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
a first feedback controller configured to calculate a first aft mover speed based on a measured temperature and optimized for use with a first heatsink; and
a second feedback controller configured to calculate a second air mover speed based on the measured temperature and optimized for use with a second heatsink having smaller surface area than the first heatsink;
logic configured to select a maximum of the first air mover speed and the second air mover speed as a selected air mover speed and generate a control signal indicative of the selected aft mover speed; and
wherein a speed of an air mover is controlled based on the control signal.

2. The system of claim 1, wherein:
the first feedback controller comprises a direct conversion controller configured to calculate the first air mover speed based on a direct correlation between the measured temperature and the first air mover speed; and
the second feedback controller comprises a proportional-integral-derivative controller configured to calculate the second air mover speed based on an error between the measured temperature and a setpoint temperature.

3. A method of comprising:
calculating a first air mover speed based on a measured temperature with a first feedback controller optimized for use with a first heatsink;
calculating a second aft mover speed based on the measured temperature with a second feedback controller optimized for use with a second heatsink having smaller surface area than the first heatsink;
selecting a maximum of the first air mover speed and the second air mover speed as a selected aft mover speed;
generating a control signal indicative of the selected aft mover speed; and
wherein a speed of an aft mover is controlled based on the control signal.

4. The method of claim 3, wherein:
the first feedback controller comprises a direct conversion controller configured to calculate the first air mover speed based on a direct correlation between the measured temperature and the first air mover speed; and
the second feedback controller comprises a proportional-integral-derivative controller configured to calculate the second air mover speed based on an error between the measured temperature and a setpoint temperature.

5. An information handling system comprising: an aft mover;
an air mover control system configured to control a velocity of the air mover, the air mover control system comprising:
a first feedback controller configured to calculate a first aft mover speed based on a measured temperature and optimized for use with a first heatsink;
a second feedback controller configured to calculate a second aft mover speed based on the measured temperature and optimized for use with a second heatsink having smaller surface area than the first heatsink;
logic configured to select a maximum of the first air mover speed and the second air mover speed as a selected air mover speed and generate a control signal indicative of the selected air mover speed; and
wherein the velocity of the air mover is controlled based on the control signal.

6. The information handling system of claim 5, wherein:
the first feedback controller comprises a direct conversion controller configured to calculate the first air mover speed based on a direct correlation between the measured temperature and the first air mover speed; and
the second feedback controller comprises a proportional-integral-derivative controller configured to calculate the second air mover speed based on an error between the measured temperature and a setpoint temperature.

* * * * *

UNITED STATES PATENT AND TRADEMARK OFFICE
CERTIFICATE OF CORRECTION

PATENT NO. : 9,823,636 B2
APPLICATION NO. : 14/445419
DATED : November 21, 2017
INVENTOR(S) : Hasnain Shabbir, Dominick A. Lovicott and Hsiang-Jung Chin Page 1 of 2

It is certified that error appears in the above-identified patent and that said Letters Patent is hereby corrected as shown below:

In the Claims

Column 7, Lines 6-19:
Please amend Claim 1 as follows:
1. A system comprising:
    a first feedback controller configured to calculate a first air mover speed based on a measured temperature and optimized for use with a first heatsink; and
    a second feedback controller configured to calculate a second air mover speed based on the measured temperature and optimized for use with a second heatsink having smaller surface area than the first heatsink;
    logic configured to select a maximum of the first air mover speed and the second air mover speed as a selected air mover speed and generate a control signal indicative of the selected air mover speed; and
    wherein a speed of an air mover is controlled based on the control signal.

Column 7, Line 29 through Column 8, Line 2:
Please amend Claim 3 as follows:
3. A method comprising:
    calculating a first air mover speed based on a measured temperature with a first feedback controller optimized for use with a first heatsink;
    calculating a second air mover speed based on the measured temperature with a second feedback controller optimized for use with a second heatsink having smaller surface area than the first heatsink;
    selecting a maximum of the first air mover speed and the second air mover speed as a selected air mover speed;
    generating a control signal indicative of the selected air mover speed; and
    wherein a speed on an air mover is controlled based on the control signal.

Signed and Sealed this
Fifth Day of June, 2018

Andrei Iancu
*Director of the United States Patent and Trademark Office*

CERTIFICATE OF CORRECTION (continued)
U.S. Pat. No. 9,823,636 B2

Column 8, Lines 13-30:
Please amend Claim 5 as follows:
5. An information handling system comprising:
    an air mover;
    an air mover control system configured to control a velocity of the air mover, the air mover control system comprising:
        a first feedback controller configured to calculate a first air mover speed based on a measured temperature and optimized for use with a first heatsink;
        a second feedback controller configured to calculate a second air mover speed based on the measured temperature and optimized for use with a second heatsink having smaller surface area than the first heatsink;
    logic configured to select a maximum of the first air mover speed and the second air mover speed as a selected air mover speed and generate a control signal indicative of the selected air mover speed; and
        wherein the velocity of the air mover is controlled based on the control signal.